United States Patent [19]

Ries

[11] Patent Number: 5,253,963
[45] Date of Patent: * Oct. 19, 1993

[54] SNAP TOGETHER WEDGELOCK

[75] Inventor: Andrew J. Ries, Minneapolis, Minn.

[73] Assignee: Honeywell Inc., Minneapolis, Minn.

[*] Notice: The portion of the term of this patent subsequent to Oct. 20, 2009 has been disclaimed.

[21] Appl. No.: 913,333

[22] Filed: Jul. 15, 1992

Related U.S. Application Data

[63] Continuation of Ser. No. 806,945, Dec. 11, 1991, Pat. No. 5,156,647.

[51] Int. Cl.⁵ .............................................. F16B 13/04
[52] U.S. Cl. ........................................ 411/75; 411/24; 411/80; 403/409.1

[58] Field of Search .................. 411/78, 24, 25, 26, 411/27, 32, 33, 75, 79, 80, 354; 403/409.1, 374; 254/42, 104

[56] References Cited

U.S. PATENT DOCUMENTS 4,824,303  4/1989  Dinger ............................ 411/79

Primary Examiner—Rodney M. Lindsey
Attorney, Agent, or Firm—Ian D. MacKinnon

[57] ABSTRACT

An improved wedgelock assembly for retaining printed wiring boards in a device. The snap-together wedgelock assembly is made up of a screw assembly and a main wedge. The main wedge having fingers for retaining the screw assembly in place.

7 Claims, 2 Drawing Sheets

SNAP TOGETHER WEDGELOCK

This application is a continuation of application Ser. No. 07/806,945 filed Dec. 11, 1991, now U.S. Pat. No. 5,156,647.

BACKGROUND OF THE INVENTION

The present invention pertains to wedgelock fastening devices for printed wiring boards. More particularly, it pertains to an improvement upon a current wedgelock fastening device.

Wedgelock fastening devices are utilized for both commercial and military applications for the purpose of retaining printed wiring boards within a chassis. The prior art part is referred to in the Defense Electronics Supply Center from Dayton, Ohio, Drawing No. 84103, and this part has a code identification number of 14933. The prior art devices comprise a main wedge which is normally adapted such that it may be fastened to a printed wiring board. A first and a second wedge are mounted on a screw assembly. This screw assembly comprises a screw which is passed longitudinally through the first wedge and then through the second wedge. The second wedge having a captive nut mounted upon it such that the screw will pass longitudinally through the wedge and then through the nut. The wedgelock assembly comprises the screw assembly and the main wedge. The screw is located in a channel in the main wedge with the first and second wedge at either end of the main wedge. The main wedge is mounted on a printed wiring board such that when the printed wiring board is inserted into a device, the wedgelock, in a relaxed condition, rides in a slot in the device. When the screw is tightened, the two wedges ride upon the main wedge expanding the wedgelock assembly, whereby the printed wiring board is retained in the device.

The main defect with the current design is in the main wedge assembly. The main wedge has a channel which the screw assembly is inserted through. The channel is hollowed out to allow the screw to pass through the main wedge. At the top of the wedge, the channel narrows to prevent the screw assembly from coming out of the channel. The narrowing of the channel at the top of the main wedge is a design requirement the military and most civilian companies require. A result of this design is the requirement that the screw assembly must be completely disassembled in order to fasten the main wedge to the printed wiring board. Then, upon the main wedge being fastened to the printed wiring board, the screw assembly must be completely reassembled. This operation is tedious and time consuming which adds cost to the manufacturer of the final device. On an individual basis the cost may be insignificant, but for assembly line production the cost of these few steps can become significant. Further, as the wedge assembly must be completely disassembled and then reassembled upon fastening the main wedge to the printed wiring board, it is not possible to place a permanent locking device on the screw to prevent the screw assembly from becoming disassembled.

SUMMARY OF THE INVENTION

Applicant's invention is an improvement upon the current wedgelock design. Applicant's improvement is a main wedge which is adapted such that the screw assembly can be either snapped into the main wedge or unsnapped out of the main wedge. This is accomplished by the top of the channel in which the screw assembly rides not being tapered. To hold the screw assembly in place, two sets of fingers are located on the main wedge which hold the screw assembly in place. The fingers are designed either to allow the screw assembly to be snapped in place or to be crimped once the screw assembly is placed in the channel.

The advantages of this device are that the wedgelock assembly no longer needs to be fully assembled when shipped to the end user. Further, there is no need to disassemble the screw assembly, as the screw assembly is merely snapped into place on the main wedge upon fastening the main wedge to the printed wiring board. A further advantage of this design is the addition of a permanent positive stop which is added to the end of the wedgelock screw to prevent the device from becoming disassembled. As a result, the wedgelock assembly is quicker and less tedious, saving the end user costs in manufacturing.

DESCRIPTION OF THE PREFERRED EMBODIMENT

Figure 1A:
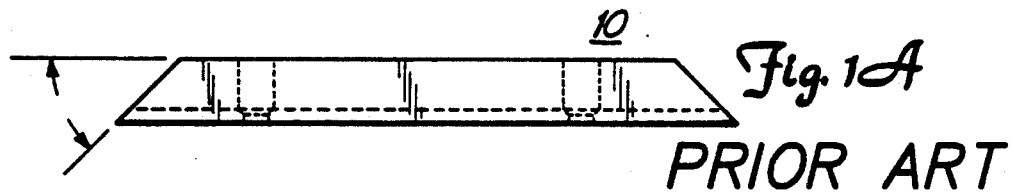
FIGS. 1a, 1b and 1c illustrate the prior art main wedge for the wedgelock assembly.
Figure 1B:
Figure 1C:
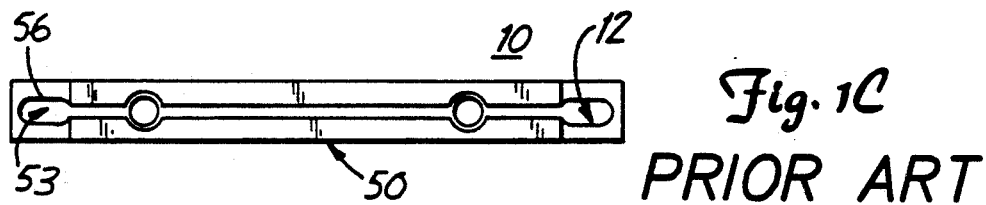

Main wedge 10 of FIGS. 1a, 1b and 1c is the prior art main wedge utilized in the wedgelock assembly. FIG. 1a illustrates the side view, FIG. 1b illustrates an end view and FIG. 1c illustrates the top view. Channel 12, as shown in FIG. 1b, is adapted such that a screw may be inserted through channel 12. Opening 13 of channel 12 is tapered at the top of channel 12, thereby preventing a screw from being removed from the channel.

Figure 2:
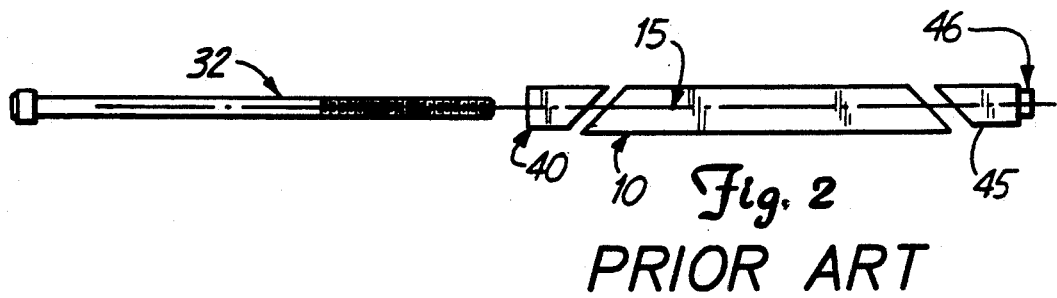
FIG. 2 illustrates an unassembled wedgelock assembly.

FIG. 2 illustrates the complete prior art wedgelock assembly. Screw 32 is inserted through first wedge 40, then through main wedge 10 along longitudinal axis 15, and finally through second wedge 45 with captive nut 46 attached. As referred to above, the tapered end 13 of channel 12 prevents screw 32 from being removed from the main wedge through the top of channel 12. Thus, in order to remove screw assembly 30, which comprises screw 32, first wedge 40 and second wedge 45, one must disassemble screw assembly 30.

Figure 3A:
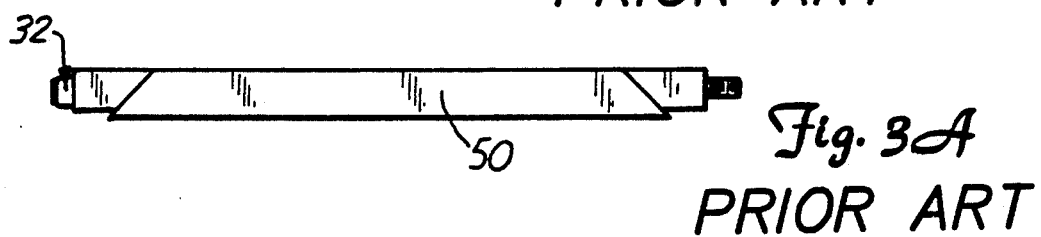
FIGS. 3a and 3b illustrate the wedgelock assembly in the relaxed and expanded position.
Figure 3B:
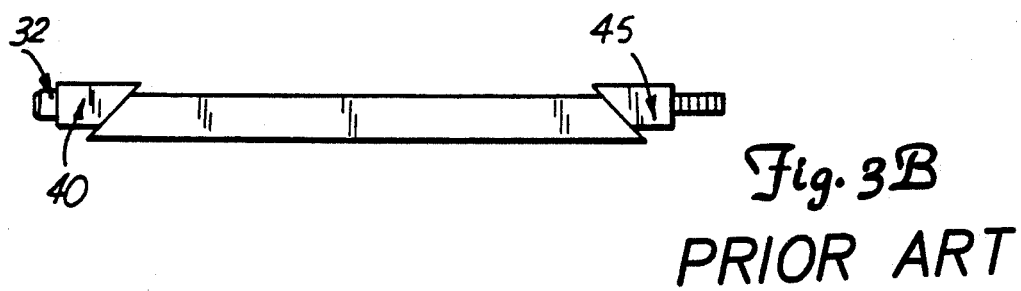

FIG. 3a and FIG. 3b illustrate the assembled wedgelock assembly. FIG. 3a illustrates the relaxed position for the wedgelock assembly. FIG. 3b illustrates the expanded wedgelock assembly. The wedgelock assembly is inserted into a slot in a device (not shown). Upon being inserted into the channel, the wedgelock assembly is expanded in order to retain the wedgelock assembly and the printed wiring board in the device.

Figure 4:
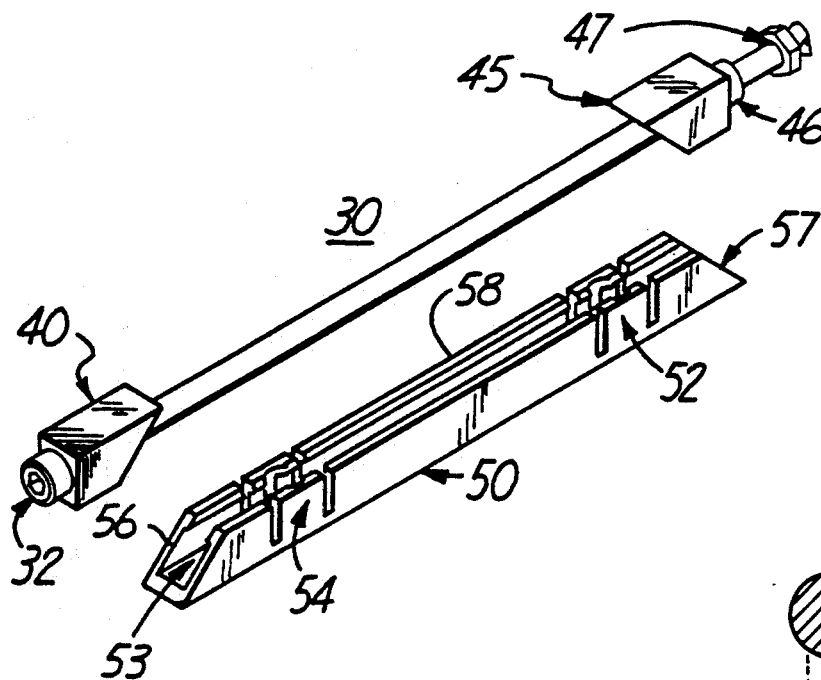
FIG. 4 illustrates the preferred embodiment wedgelock assembly which utilizes fingers to retain the screw assembly in place.
Figure 5:
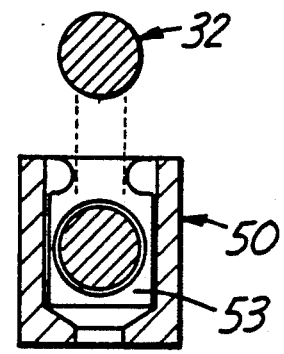
FIG. 5 illustrates the channel for the preferred embodiment.

FIG. 4a illustrates the improvement upon the prior art. For this embodiment, main wedge 50 utilizes a pair of fingers 52 and 54 in order to retain screw assembly 30 in place. Main wedge 50 has a first end 56, a second end 57 and a top portion 58. Top portion 58 being open to allow screw assembly 30 to be inserted into channel 53. Screw assembly 30, again, comprises screw 32, first wedge 40, second wedge 45 and captive nut 46. In addition, due to the use of fingers, it is possible now to add positive stop 47 to the end of screw 32. For the preferred embodiment, positive stop 47 is a standard nut with lock-tight thread to prevent movement. The end of screw 32, behind positive stop 47, is crimped in order to retain positive stop 47 in place. As shown in FIG. 5, fingers 52 and 54 allow for the shaft of screw 32 to be inserted into channel 53 of main wedge 50 and to be removed from channel 53. Fingers 52 and 54 are flexible such that they allow screw assembly 30 to be inserted into main wedge 50; however, fingers 52 and 54 will not allow screw assembly 30 to fall out of channel 53.

Figure 6A:
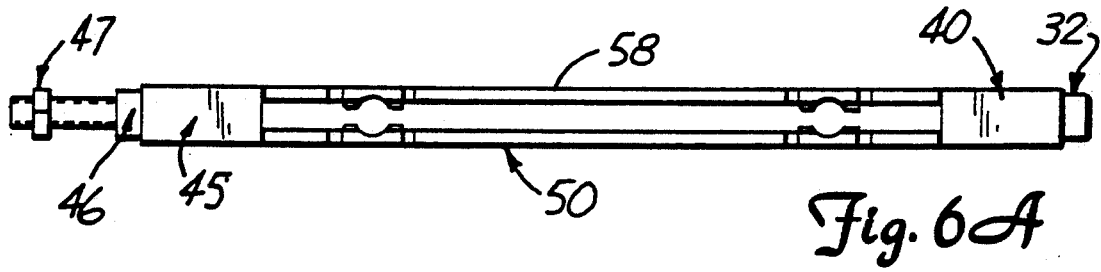
FIGS. 6a and 6b illustrate top and side views of the preferred embodiment assembled.
Figure 6B:
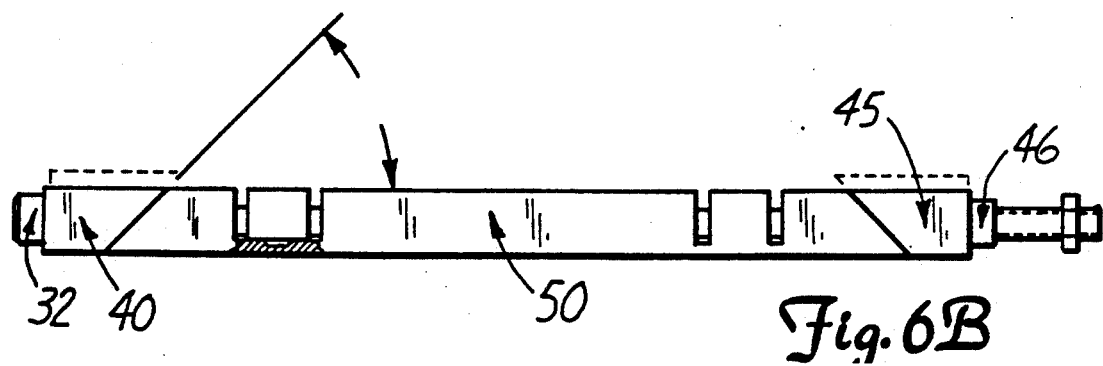

FIGS. 6a and 6b illustrate the assembled snap-together wedgelock assembly. FIG. 6a is a top view and FIG. 6b is a side view. Due to the use of fingers, it is possible for the wedge assembly to be preassembled prior to use and upon mounting main wedge 50 on the printed wiring board, screw assembly 30 is simply snapped into place. With the addition of positive stop 47, second wedge 45 will not come off the end of screw 32 during disassembly. Further, due to use of fingers 52 and 54, it is possible to remove screw assembly 30 without completely disassembling screw assembly 30. To remove the screw assembly, place screw assembly 30 in the relaxed position, remove the printed wiring board from the channel and snap screw assembly 30 out of main wedge 50.

Although the preferred embodiment illustrates a main wedge which utilizes fingers for retaining screw assembly 30, it is possible that main wedge 50 be designed such that instead of fingers the screw assembly is completely assembled and then the top portion of the main wedge 50 is crimped in order to retain screw assembly 30 in place.

I claim:

1. A snap-together wedgelock assembly comprising:
   a screw assembly comprising a screw, a first wedge and a second wedge, said screw being passed through said first wedge and said second wedge; and
   a main wedge having a longitudinal axis, a first end, a second end and a top portion, said main wedge further having a channel along said longitudinal axis being open at said first end, said second end and said top portion, said channel adapted such that said screw may be inserted into said channel through said top portion and along said longitudinal axis, said main wedge having deformable walls on opposite sides of said channel along at least a portion of said longitudinal axis, said deformable walls retaining said screw when said screw assembly is inserted into said main wedge, wherein said first wedge is located at said first end, said second wedge is located at said second end and said screw is located in said channel along said longitudinal axis.

2. The snap-together wedgelock assembly of claim 1 wherein said screw assembly further comprises a positive stop.

3. The snap-together wedgelock assembly of claim 2 wherein said positive stop comprises a nut located about said screw, said screw being crimped behind said nut to retain said nut on said screw.

4. The snap-together wedgelock of claim 1 wherein said deformable walls are crimped together to retain said screw in said channel.

5. A snap-together wedgelock assembly comprising:
   a screw assembly comprising a screw, a first wedge and a second wedge, said screw being passed through said first wedge and said second wedge; and
   a main wedge having a longitudinal axis, a first end, a second end and a top portion, said main wedge further having a channel along said longitudinal axis being open at said first end, said second end and said top portion, said channel adapted such that said screw may be inserted into said channel through said top portion and along said longitudinal axis, said main wedge further comprising retaining means, said retaining means retaining said screw when said screw assembly is inserted into said main wedge along said longitudinal axis, wherein said first wedge is located at said first end, said second wedge is located at said second end and said screw is located in said channel along said longitudinal axis.

6. The snap-together wedgelock assembly of claim 5 wherein said screw assembly further comprises a positive stop.

7. The snap-together wedgelock assembly of claim 6 wherein said positive stop comprises a nut located about said screw, said screw being crimped behind said nut to retain said nut on said screw.

* * * * *